United States Patent [19]
Solin et al.

[11] Patent Number: 5,965,283
[45] Date of Patent: Oct. 12, 1999

[54] GMR ENHANCEMENT IN INHOMOGENEOUS SEMICONDUCTORS FOR USE IN MAGNETORESISTANCE SENSORS

[75] Inventors: Stuart A. Solin, Princeton Junction; Tineke Thio, Princeton, both of N.J.

[73] Assignee: NEC Research Institute, Inc., Princeton, N.J.

[21] Appl. No.: 08/997,264

[22] Filed: Dec. 23, 1997

[51] Int. Cl.[6] ................................................ G11B 5/66
[52] U.S. Cl. .................... 428/692; 428/611; 428/694 R; 428/694 T; 428/694 TS; 428/900; 360/113; 324/252; 338/32 R
[58] Field of Search ................................ 428/611, 692, 428/694 R, 694 TS, 694 T, 900; 360/113; 324/252; 338/32 R

[56] References Cited

U.S. PATENT DOCUMENTS

| | | | |
|---|---|---|---|
| 5,622,874 | 4/1997 | Seidler | 438/3 |
| 5,696,655 | 12/1997 | Kawano | 360/113 |
| 5,699,215 | 12/1997 | Solin | 360/113 |

OTHER PUBLICATIONS

Herring, "Effect of Random Inhomogeneities on Electrical and Galavanomagnetic Measurements", Journal of Applied Physics, vol. 31, No. 11, pp. 1939–1953, Nov. 1990.
Wolfe et al., "High Apparent Mobility in Inhomogeneous Semiconductors", Journal of the Electrochemical Society, vol. 119, No. 2, pp. 250–255, Feb. 1972.
Solin et al., "Self–Biasing Nonmagnetic Giant Magnetoresistance Sensor", Applied Physics Letter 69 (26), pp. 4105–4107, Dec. 23, 1996.
Dieny et al, "Magnetotransport Properties of Magnetically Soft Spin–Valve Structures", Journal Applied Physics 69 (8), pp. 4774–4779, Apr. 15, 1991.
Dieny et al, "Giant Magnetoresistance in Soft Ferromagnetic Multilayers", Physical Review B, vol. 43, No. 1, pp. 1297–1300, Jan. 1, 1991.
Korol' et al, "Magnetoresistance of CdHgTe Near Gapless State", Sov. Phys. Semicond., vol. 11, No. 3, pp. 288–289, Mar. 1977.
Korol' et al. Investigation of $Cd_xHg_{1-x}Te$ Magnetoresistors in the Temperature Range 4,2–300°K, Sov. Phys. Semicond. 12(3), pp. 275–276, Mar. 1978.
Wolfe et al, "Anomalously High "Mobility" in Semiconductors", Applied Physics Letters, vol. 18, No. 5, pp. 205–208, Mar. 1, 1971.

*Primary Examiner*—Leszek Kiliman
*Attorney, Agent, or Firm*—Philip J. Feig

[57] ABSTRACT

The low-field magnetoresistance of a high carrier mobility semiconductor with inhomogeneities which are more conducting than the surrounding semiconductor material matrix is significantly enhanced compared to the magnetoresistance of the homogeneous material. The enhancement results from a magnetic field induced geometric effect in which current is expelled from the conducting inhomogeneity. The enhanced giant magnetoresistance is demonstrated at low field in (near) zero-band-gap material, such as $Hg_{1-x}Cd_xTe(x\sim0.1)$. The effect is applied to the fabrication of magnetic read head sensors such as Corbino disc, bar magnetoresistance sensors and thin film sensors.

24 Claims, 6 Drawing Sheets

Figure 6 ical, 35 ciated or explained. Solin et al supra realized the techno-
GMR ENHANCEMENT IN INHOMOGENEOUS SEMICONDUCTORS FOR USE IN MAGNETORESISTANCE SENSORS

FIELD OF THE INVENTION

The present invention relates to sensors and particularly to giant magnetoresistive (GMR) sensors.

BACKGROUND OF THE INVENTION

Various types of sensors exhibiting magnetoresistive characteristics are known and implemented in systems, particularly for reading of information signals recorded in magnetic media such as tapes, drums and diskettes. These sensors typically comprise a block made of a ferromagnetic alloy exhibiting high magnetoresistance. A recording medium passing in close proximity to such a sensor causes variations in the magnetic field at the point of the read head, and hence variations of the electrical resistance of the magnetoresistive sensor.

Recently however, magnetoresistive sensors have been described exhibiting a form of magnetoresistance generally known as "spin-valve"(SV) magnetoresistance, in which the change in resistance of the sensor is attributed to the spin-dependent transmission of conduction electrons between the magnetic layers of the sensor and the accompanying spin-dependent scattering at the layer interfaces. In such a sensor, the magnetoresistance is observed to vary as the cosine of the angle between the magnetizations of the layers and is dependent upon the deviation of current flow through the sensor. While such sensors exhibit a magnetoresistance that, for selected combinations of materials, is greater in magnitude than that exhibited by anisotropic magnetoresistors (AMR), they suffer from the relatively small magnitudes of the magnetoresistance at ambient temperatures.

Most recently, magnetoresistance sensors for reading/writing information signals stored on a magnetic medium have been described in issued patents and patent applications Ser. No. 08/396,819, filed Mar. 2, 1995 now abandoned; U.S. Pat. No. 5,646,051, issued Jul. 8, 1997; U.S. Pat. No. 5,696,655, issued Dec. 9, 1997; Ser. No. 08/781,994, filed Jan. 6, 1997 now pending and Ser. No. 08/917,058, filed Aug. 22, 1997 now pending, each assigned to the same assignee as the instant application and incorporated herein by reference.

The prior art also describes non-magnetic giant magnetoresistive sensors constructed from a thin film of non-homogeneous semiconducting magnetoresistive material, e.g. mercury cadmium telluride.

It is often assumed that microscopic inhomogeneities in semiconductors cause a diminution of the carrier mobility due to the additional scattering associated with the inhomogeneity. However, following the seminal work of C. Herring, entitled "Effect of Random Inhomogeneities on Electrical and Galvanomagnetic Measurements", in Journal of Applied Physics, Vol. 31, No. 11, pps. 1939–1953 (1960), C. M. Wolfe et a, in an article entitled "High Apparent Mobility in Inhomogeneous Semiconductors" in Solid State Science and Technology, Vol. 119, No. 2, pps. 250–255 (1972) showed that conducting inhomogeneities in semiconductors could actually result in a huge increase in the "apparent" Hall mobility relative to the actual carrier mobility by as much as a factor of $10^3$. The present invention shows that the same physical effect which boosts the Hall mobility also boosts the apparent giant magnetoresistance (GMR), and that this GMR boost may have important consequences for magnetic sensor technology, especially for high mobility semiconductor read-heads in high density magnetic recording.

One such high mobility semiconductor is mercury-cadmium-telluride (MCT) which has the alloy composition $Hg_{1-x}Cd_xTe$, $0<x<1$. The alloy with composition x~0.22 has been extensively employed as a radiation emitter and detector compound in optical devices operating in the 10 $\mu$m spectral region. Recently, however, Solin et al., in an article entitled "Self-biasing nonmagnetic giant magnetoresistance sensor", in Applied Physics Letter, 69 (26), pps. 4105–4107 (1996) have shown that the thin film MCT with a composition of x~0.1, corresponding to a (near) zero band-gap, exhibited a CGMR (measured using the Corbino disc geometry) which made it competitive with., if not superior to, more conventional metallic GMR detectors such as spin-valves as described by B. Dieny et al, in an article entitled "Magnetotransport properties of magnetically soft spin-valve structures", in Journal Applied Physics, 69 (8), pps. 4774–4776 (1991) and B. Dieny et al, in an article entitled "Giant magnetoresistance in soft ferromagnetic multilayers", Physical Review B, Vol. 43, No. 1, pps. 1297–1300, (1991). This superiority was in part a consequence of the enhancement of the low field GMR ($\mu H<1$ where $\mu$ is the carrier mobility) by a factor of 30 or more over that which was expected on the basis of the high field GMR as noted in Solin et al. Indeed, this low field enhancement had been observed in bulk material many years ago by Korol' et al., in an article entitled "Magnetoresistance of CdHgTe near gapless state", in Sov. Phys. Semicond., Vol. 11, No. 3, pps. 288–289 (1977) and by Korol' et al., in an article entitled "Investigation of $Cd_xHg_{1-x}Te$ magnetoresistors in the temperature range 4.2–300° K.", in Sov. Phys. Semicond., 12 (3), pps 275–277 (1978) but was not appreciated or explained. Solin et al supra realized the technological significance of the enhanced GMR and used a phenomenological model to describe it, but acknowledged a lack of understanding of the physics underlying the enhancement.

SUMMARY OF THE INVENTION

The present invention shows that the observed enhancement or boost in the low field GMR of high carrier mobility semiconductor materials, such as $Hg_{1-x}Cd_xTe$, x~0.1, results from inhomogeneities which are more conducting than the surrounding matrix material.

The preparation of the $Hg_{1-x}Cd_xTe$ films studied here has been described in detail as have the experimental details of the magnetotransport measurements in Solin et al supra. A brief summary of this information is as follows. Undoped, unannealed samples were grown on single-crystal Si substrates by conventional molecular-beam epitaxy (MBE) methods using an approximately 4 $\mu$m buffer layer of undoped CdTe followed by the $Hg_{1-x}Cd_xTe$ layer of thickness d=4.6 $\mu$m. Both layers contained microscopic inhomogeneities estimated from scanning electron microscope measurements to be in the range 300–2200Å.

The Hall-bar geometry was used for the magnetotransport measurements discussed here. Electrical contacts, which were Ohmic to 4K, were made to the samples by evaporating pure In in lithographically defined areas as shown for the six-probe Hall-bar geometry in the inset of FIG. 1. Copper wires were attached to the In pads using conductive silver paint. All of the resistance measurements were done in the four-probe configuration, in order to eliminate any effects of contact and lead resistance. The magnetic field was applied perpendicular to the film.

In the present invention there is provided an explanation for the observed enhanced effect as well as sensor embodiments using the enhanced effect for improved GMR sensors.

The low-field magnetoresistance (MR) of a semiconductor with inhomogeneities which are more conducting than the surrounding matrix of homogeneous semiconductor material is significantly enhanced compared to that of the homogeneous material. The enhancement results from a magnetic field induced geometric effect in which the current is deflected around the inhomogeneity.

Specifically, in fabricating a Corbino sensor, an open ring of conducting material is concentrically disposed relative to the inner electrode at a location between the inner electrode and concentric outer electrode of the Corbino disc sensor. By leaving a small opening or gap in the ring, the magnetoresistance of the sensor can be varied since it is responsive to the size of the gap and the other geometric properties of the gapped ring. The result is a Corbino disc sensor exhibiting enhanced detection properties.

Similarly, locating a conductive material at the surface of or embedded in a Hall bar causes a similar enhanced effect on the magnetoresistance of the Hall bar.

A principal object of the present invention is the provision therefore, of a sensor structure exhibiting an enhanced low-field GMR.

Another object of the present invention is the provision of a Corbino disc sensor exhibiting enhanced GMR.

A further object of the invention is the provision of a bar sensor exhibiting enhanced GMR.

A still further object of the invention is the provision of a thin film sensor exhibiting enhanced GMR.

Further and still other objects of the present invention will become more clearly apparent when the following description is read in conjunction with the following drawing.

BRIEF DESCRIPTION OF THE DRAWING

FIG. 4b is a side view, in section, of the Corbino disc-type magnetoresistance sensor shown in FIG. 4a;

FIG. 5b is side view, in section, of the bar-type magnetoresistance sensor shown in FIG. 5a.

DETAILED DESCRIPTION

Figure 1:
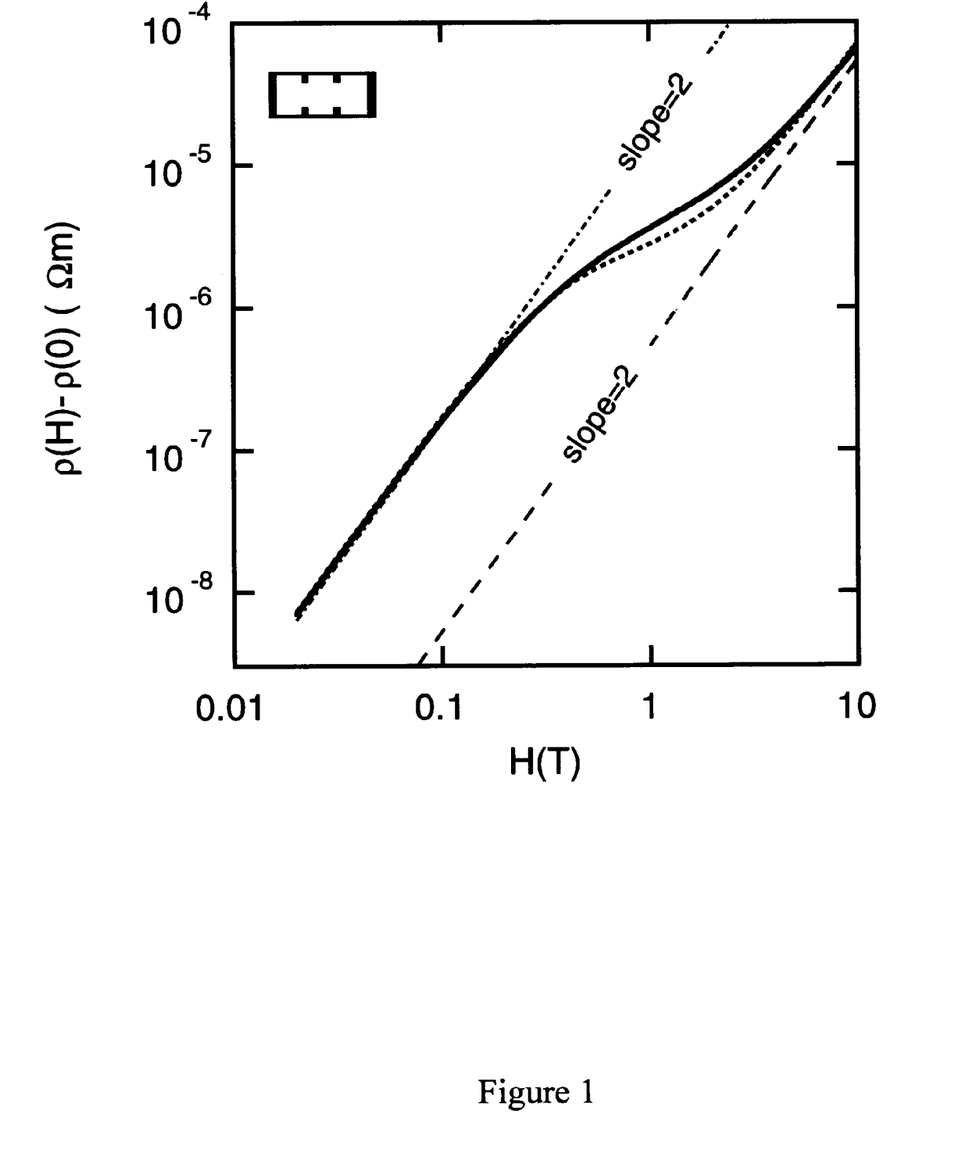
FIG. 1 is a graphical representation of the room-temperature differential resistance of $Hg_{1-x}Cd_xTe$, x~0.1, measured in a 6-probe Hall bar configured as shown in the inset.

Referring now to the figures and to FIG. 1 in particular, there is shown a graphical representation of the room-temperature differential resistance of $Hg_{1-x}Cd_xTe$, x~0.1 measured in a 6-probe Hall probe configured as shown in the inset. The solid line is the measured data. The dashed line shows $\mu_e\mu_h H^2$ while the dash-dot line is computed from $30(\mu_e\mu_h H^2)$, where $\mu_e$ is the electron mobility, $\mu_h$ is the hole mobility, and H is the magnetic field. The dotted line is a least-squares fit to the data using equations 6 and 7 below, with $\alpha$=0.4 and s(0)=1.3. The differential resistance, $\Delta\rho_{xx}(H)=\rho_{xx}(H)-\rho_{xx}(0)$, is seen to follow a quadratic field dependence at low and high field, but with a higher curvature, $d^2\rho/dH^2$, at low field than at high field. The crossover occurs at approximately H=0.4 Tesla.

Figure 2:
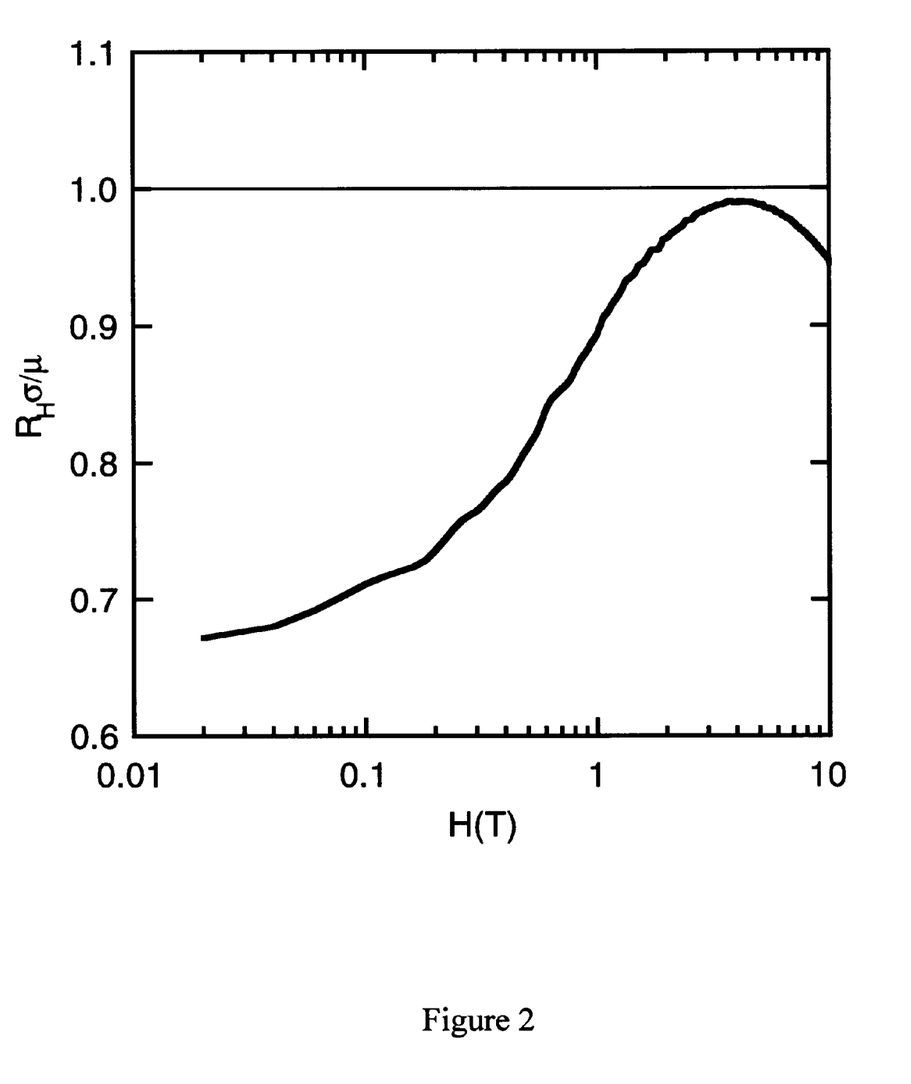
FIG. 2 is a graphical representation of the field dependence of the normalized Hall coefficient, $R_H/[\mu/\sigma]$, of $Hg_{1-x}Cd_xTe$, x~0.1, measured at room temperature.

FIG. 2 shows the room temperature field dependence of the Hall coefficient, measured simultaneously with the data in FIG. 1. There is a pronounced increase in the Hall coefficient with increasing field and the appearance of saturation in the high field region. Both the differential resistance and the Hall data are anomalous compared to that exhibited by homogeneous semiconductors for which the differential resistance increases quadratically with the field, with the same curvature at all fields, and the Hall coefficient decreases monotonically with field. In the following description these anomalies will be considered using a novel modification of a model previously developed by Wolfe et al supra, who showed that with increasing field, current is deflected around a conducting inhomogeneity in a semiconductor, a notion that was first explored by Herring supra.

To briefly clarify this key point, it should be noted that for a one-carrier thin film material in an xy plane with the applied magnetic field normal to the plane (in the z direction), the magnetoconductivity tensor components are $\sigma_{xx}(\beta)=\sigma_{yy}(\beta)=\sigma_0/[1+\beta^2], \sigma_{zz}(\beta)=\sigma_0, \sigma_{xy}(\beta)=-\sigma_0\beta/[1+\beta^2]=-\sigma_{yx}(\beta)$ with $\beta=\mu H$ and all other components being zero. The electric field will tend to be normal to the equipotential surface of a highly conducting inhomogeneity in the film. Let this field at an arbitrary point on the surface be $\vec{E}=E_x\hat{x}+E_y\hat{y}$. At zero field the current density is $\vec{J}//\vec{E}$. But at high magnetic field $\beta^2>>1$ and $\vec{J}=\sigma\vec{E}\approx(\sigma_0/\beta)[-E_y\hat{x}+E_x\hat{y}]$. Then $\vec{J}\bullet\vec{E}=0$ and the current tends to be tangent to, i.e. deflect around, the inhomogeneity. At low field this deflection varies as $H^2$, while it is total at sufficiently high field in which case the current flows only through the matrix material. For this reason the Hall coefficient saturates to 1/ne in the high field limit; here n is the carrier density and e is the carrier charge. The field-dependent current deflection also has an effect on the measured magnetoresistance. The deflection results in a decrease in the cross-sectional area through which current can flow and therefore in an increase of the resistance of the material even if the resistivity itself were field-independent. This geometric effect boosts the measured GMR above that expected in the absence of inhomogeneities.

Figure 3:
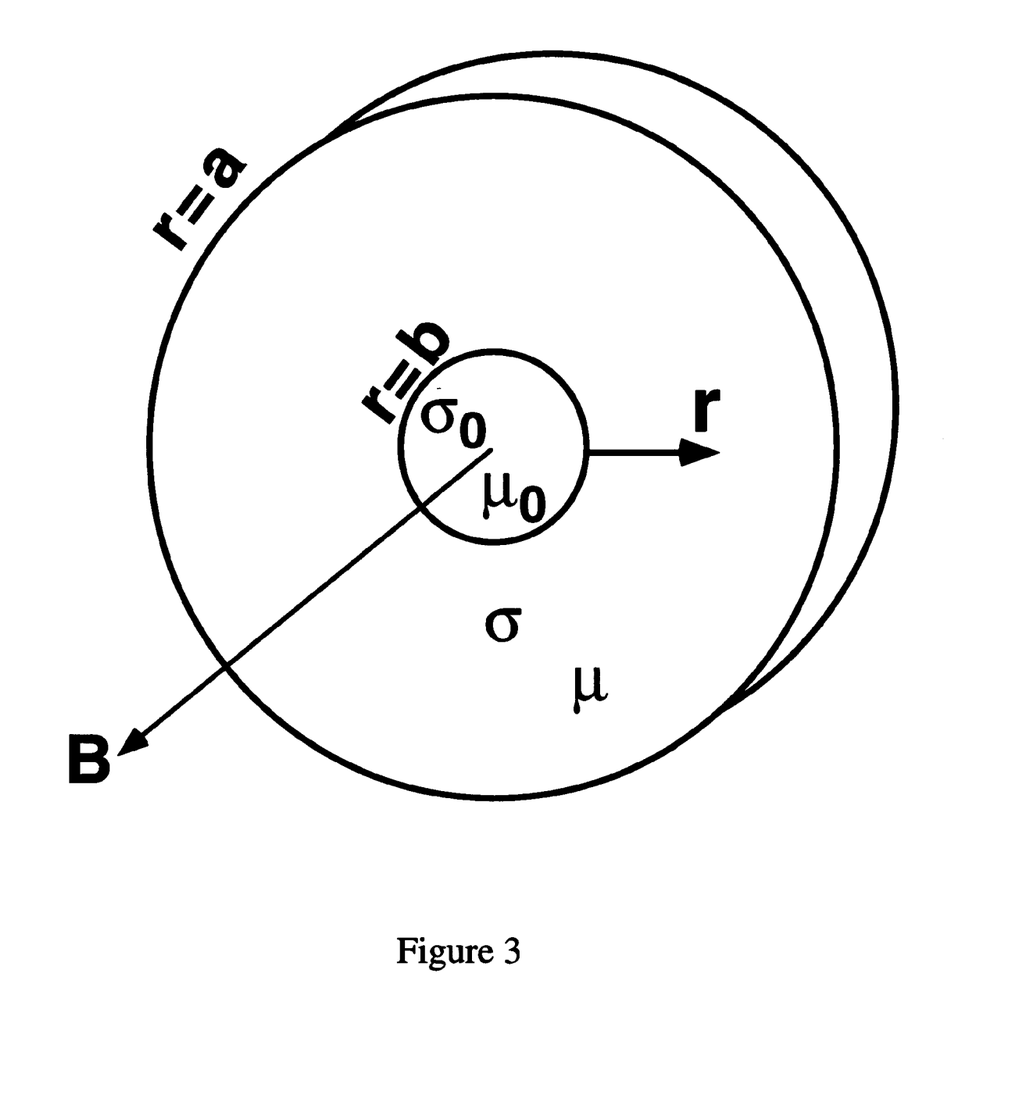
FIG. 3 is a schematic diagram of a cylindrical inhomogeneity of conductivity $\sigma_0$ and mobility $\mu_0$ surrounded by a homogeneous matrix of conductivity $\sigma$ and mobility $\mu$.

Wolfe et al supra considered the specific case of a van der Pauw disk configuration with a conducting circular macroscopic inhomogeneity of conductivity $\sigma_0$ and mobility $\mu_0$ in the center of a homogeneous semiconductor matrix of conductivity $\sigma$ and mobility $\mu$ as shown in FIG. 3. For this configuration, and under the assumption that the resistivity of the semiconductor material is field-independent, the field-dependent current deflection, a purely geometric effect, gives rise to a field-dependent apparent resistance:

$$\rho_{app}\left(\alpha, \frac{\sigma_0}{\sigma}\right) = \qquad (1)$$

$$\frac{1}{\sigma \ln 2} \sum_{n=1}^{\infty} \left[ \frac{2(1-\gamma\alpha^{2n})}{1+\gamma\alpha^{2n}} - \frac{(1-\gamma\alpha^{4n})}{1+\gamma\alpha^{4n}} \right] \frac{(-1)^{n+1}}{n} = \frac{G(\gamma, \alpha)}{\sigma},$$

where $\alpha = b/a$, b is the radius of the inhomogeneity, a is the radius of the homogeneous semiconductor matrix, and $$\gamma = \frac{(\Omega_0^2 - \Omega^2) + \beta^2 (m\Omega_0 - \Omega)^2}{(\Omega_0 + \Omega)^2 + \beta^2 (m\Omega_0 - \Omega)^2}. \qquad (2)$$

Here $\Omega_0 = s/[1+m\beta^2]$, $\Omega = 1/[1+\beta^2]$, $s = \sigma_0/\sigma$, $m = \mu_0/\mu$, and $\beta = \mu H$.

In the model of Wolfe et al supra, the field dependence of $\rho_{app}$ is incorporated in the term $G(\gamma,\alpha)$ in Eq. (1) and is entirely geometrical in origin since the conductivity and mobility of both the inhomogeneity and matrix are assumed to be field-independent. For (near) zero-gap MCT, the mobility is indeed approximately field-independent near room temperature. However, the conductivity is field-dependent and of the standard form appropriate for an intrinsic semiconductor:

$$\sigma(H) = \frac{\sigma(0)}{1 + \mu_e \mu_h H^2}; \qquad (3)$$

$$\sigma_0(H) = \frac{\sigma_0(0)}{1 + \mu_{0e} \mu_{0h} H^2}, \qquad (4)$$

where $\mu_e$ and $\mu_h$ ($\mu_{0e}$ and $\mu_{0h}$) are the electron and hole mobilities, respectively, in the matrix (inhomogeneity). Thus, the conductivity ratio s is also field-dependent and is given by $$s(H) = \frac{\sigma_0(H)}{\sigma(H)} = s(0) \frac{1 + \mu_e \mu_h H^2}{1 + \mu_{0e} \mu_{0h} H^2}. \qquad (5)$$

Assume that the carrier concentration in the inhomogeneities is equal to that in the original matrix, so that $s(0) = m(0) = \mu_{0e}/\mu_e$. However, in fitting the data to the model, let $m(H) = s(H)$ at each field, in order to account for the fact that $s(H) \to 1$ at very large fields. Incorporating these assumptions and Eqs. (3)–(5) into Eqs. (1) and (2) the result is:

$$\rho_{app}(H) = \left[\frac{1}{\sigma(H)}\right] G(\alpha, s(0), H) \qquad (6)$$

and $$[\Delta\rho_{app}(H)]_{xx} = [\rho_{app}(H)]_{xx} - [\rho_{app}(0)]_{xx}. \qquad (7)$$

Eq. (5) is used to fit the data of FIG. 1 with $\alpha$ and s(0) as adjustable parameters. The result of this fit is shown as a dotted line in FIG. 1 and is in reasonable agreement with the experimental data except in the crossover region between low and high fields. This disparity is discussed below. The crossover occurs when $\beta \equiv 1$; the mobility corresponding to a crossover field of 0.4T is $2.2 \times 10^4$ cm$^2$/Vs, in good agreement with the value $2.8 \times 10^4$ cm$^2$Vs obtained from the fit. The fit is relatively insensitive to the exact values of $\alpha$ and s(0) which are in the ranges 0.2–0.5 and 2.7–1.7, respectively, with low values of $\alpha$ being correlated with high values of s(0). As can be seen from FIG. 1 and Eqs. (1–5), the geometric contribution to the differential resistance is quadratic in H at low field and saturates at high field. It therefore significantly boosts the low field differential resistance and GMR which, in a purely homogeneous material, would be given by $\mu_e \mu_h H^2$ at both low and high fields as indicated by the dashed line in FIG. 1.

Although the original model of Wolfe et al was formulated for a macroscopic circular inhomogeneity as depicted in FIG. 3, it has previously been invoked to explain anomalously enhanced mobilities in semiconductors with microscopic conducting inhomogeneities as well, citing an article by C. M. Wolfe et al, entitled "Anomalously High "Mobility" in Semiconductors", Applied Physics Letters, Vol. 18, No. 5, pps. 205–208 (1971). The justification for this is that such microscopic inhomogeneities can reasonably be modeled as an ensemble of circular disks and that the spatial distribution of such disks in the matrix material would manifest itself through superposition as a scale factor in the differential resistance or GMR. Note however that because the contribution from each microscopic disc will be quadratic in field at low field, it is only in the crossover region that the non-quadratic field dependence of the differential resistance will be affected. Most likely, it is such a distribution-induced modification of the field dependence which is responsible for the discrepancy between the measured and calculated differential resistance shown in FIG. 1.

We now address the Hall data of FIG. 2. The main focus of the work of Wolfe et al was to explain anomalously large measured mobility values in semiconductor materials. They identified several transport data signatures of the presence of inhomogeneities, the most definitive of which was the field dependence of the Hall coefficient. In particular, when such inhomogeneities significantly affect the measurement of the mobility, the normalized Hall coefficient, $R_H/[\mu/\sigma]$, will show a monotonic increase with field at low field ultimately saturating to unity at high field. In contrast, the field dependence of the Hall coefficient of a homogeneous material will show a monotonic decrease with field, since the Hall factor is larger than unity for most materials, followed by saturation to unity at high field. This "normal" behavior is merely reflective of the field dependence of the Hall factor. As can be seen from FIG. 2, the Hall data of Hg$_{1-x}$Cd$_x$Te, x~0.1 exhibits the anomalous behavior indicative of the presence of conducting inhomogeneities in accord with the Wolfe model. The small decrease of the Hall coefficient observed at high field results from the onset of hole contributions to $R_H$ of Hg$_{1-x}$Cd$_x$Te, 0<x<1 as described in Solin et al. From the above it is now clear that the same inhomogeneities which give rise to a self biasing zero-field offset in Hg$_{1-x}$Cd$_x$Te, 0<x<1 are also responsible for the GMR boost shown in FIG. 1 as well as the anomalous Hall effect shown in FIG. 2.

Figure 4A:
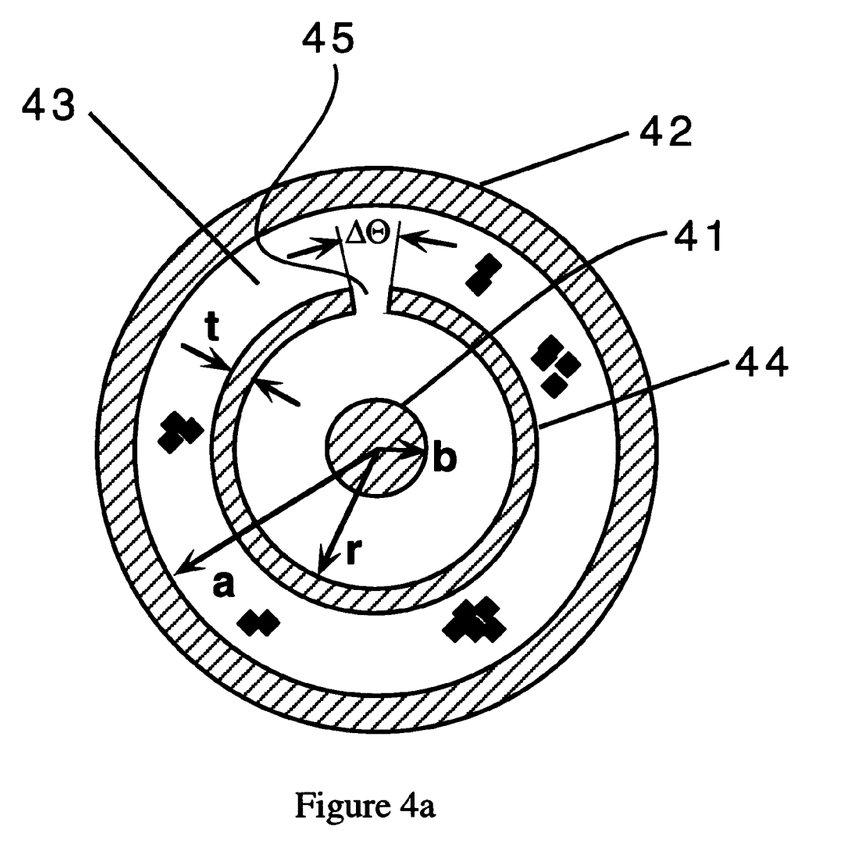
FIG. 4a is a plan view of a Corbino disc-type magnetoresistive sensor modified in accordance with the teachings of the present invention.
Figure 4B:
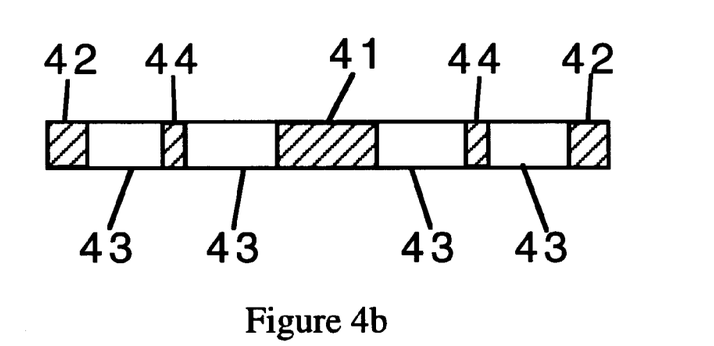

The GMR boost described above has important practical applications. Moreover, by purposely introducing microscopic conducting regions into a high mobility semiconductor by, for example, over-doping InSb with In during the growth phase, one could significantly enhance its GMR. But it may be difficult to control/design microscopic inhomogeneities to achieve a desired specific result. Perhaps a more attractive approach may be to incorporate macroscopic inhomogeneities into the conducting path by, for instance, embedding a conducting region of appropriate size and shape into the current path of a thin film semiconductor. For a fully embedded conductor which penetrates the entire thickness of the film, the field-induced deflection of the current around the vertical interface (with the direction normal to the interface between the matrix material and the inhomogeneity being orthogonal to the direction of the applied magnetic field H) between the inhomogeneity and the matrix will enhance the intrinsic GMR of the material but the enhancement will not depend on film thickness. For a partially embedded material which could be obtained by post diffusion into the film of an appropriately patterned metallic overlayer, the enhancement will increase with decreasing film thickness and may be further increased by tilting the direction of the applied magnetic field so that the field has a component parallel to the horizontal interface between the inhomogeneity and the matrix. The introduction of such a macroscopic inhomogeneity as described above represents a simple and cost effective method for boosting the sensitivity of magnetoresistive field sensors such as semiconductor read-heads for high density magnetic recording as shown in FIG. 4a and FIG. 4b. In FIG. 4a, a plan view of a Corbino disc magnetoresistive sensor is shown with an inner conductive electrode 41 of radius b and an outer conductive, electrode 42 of radius a embedded in a layer of homogeneous semiconductor material 43 of high carrier mobility, preferably $Hg_{1-x}Cd_xTe$, x~0.1. While mercury cadmium telluride is not a low conductivity material, generally it is preferable that the semiconductor material has low-conductivity. In accordance with the teachings of the present invention, a macroscopic inhomogeneity, in the form of a split conducting ring 44 of radius r and thickness t having a gap of angular width Δθ at region 45 is included in the Corbino disc. The magnetoresistance is greatly enhanced by inclusion of the gapped ring 44.

As shown in FIG.4b, the ring 44 and the electrodes 41 and 42 are embedded in the semiconductor material 43. When a voltage is applied across the electrodes and current travels from the center electrode 41 to the outer electrode 42 in the presence of a magnetic field that is normal to the sensor plane, the ring 44 enhances current flow at zero magnetic field but acts as a barrier to the current at finite magnetic field, except in the region of the gap 45. The resultant constricted path from the electrode 41 to the electrode 42 through gap 45 of ring 44 enhances the magnetoresistance of the sensor. The result is a GMR sensor with enhanced sensitivity. The semiconductor material 43 may be selected from the group of materials including $Hg_{1-x}Cd_xTe$, InSb, InAs, $InAs_{1-y}Sb_y$, y~0.6, and the like. The magnetoresistance of the sensor shown in FIG. 4a will depend on the relative dimension t/(a−b) and on the gap. The dimensions of t, a and b may vary over a wide range from a few hundred angstroms to millimeters while the gap may typically subtend an angle in the range of 1° to 10°.

Figure 5A:
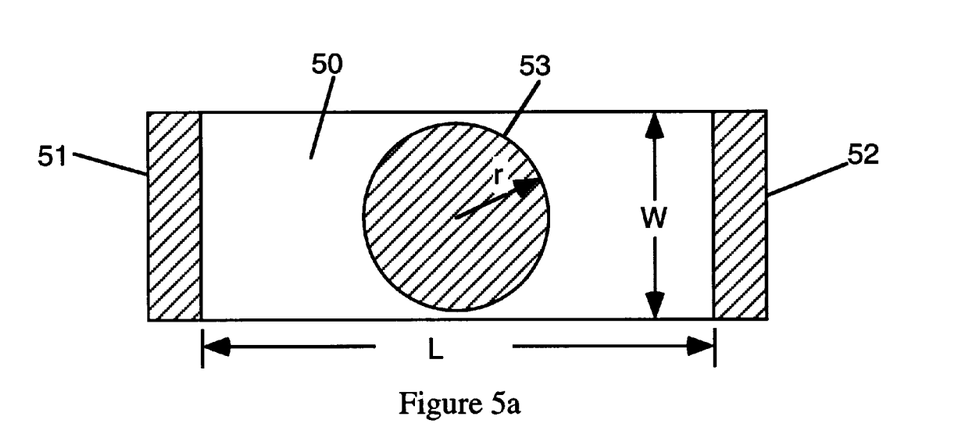
FIG. 5a is a plan view of a bar-type magnetoresistance sensor modified in accordance with the teachings of the present invention.
Figure 5B:
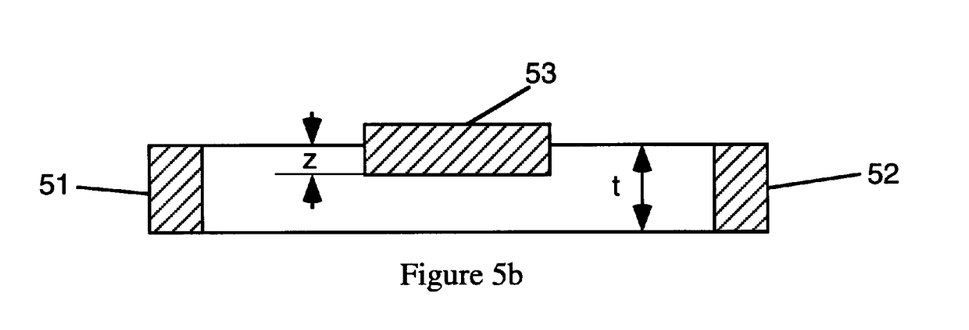

FIG. 5a shows a plan view of a bar 50 of high carrier mobility, preferably having low-conductivity, semiconductor material of width w having conducting electrodes 51 and 52 disposed at opposite ends of the bar 50. By embedding a suitably dimensioned disk of conducting material 53 of radius r at a suitable location within the bar as shown in FIG. 5b, an enhanced GMR sensor will be created. The disk of conducting material 53 is dimensioned to have a cross-section approximately the same as that of the bar 50 and is embedded to a depth z in the semiconductor material the thickness of which is t. In the presence of a magnetic field, current traveling from one end electrode to the other end electrode will encounter resistance in the path by virtue of its deflection around the conducting disk 53. The current flow is restricted to the narrow region between the outer dimension of the conducting disk 53 and the outer dimensions of the bar 50. The magnetoresistance will depend on the relative dimensions r/w and z/t, whose individual dimensions may vary over a wide range from a few hundred angstroms to millimeters.

Figure 6:
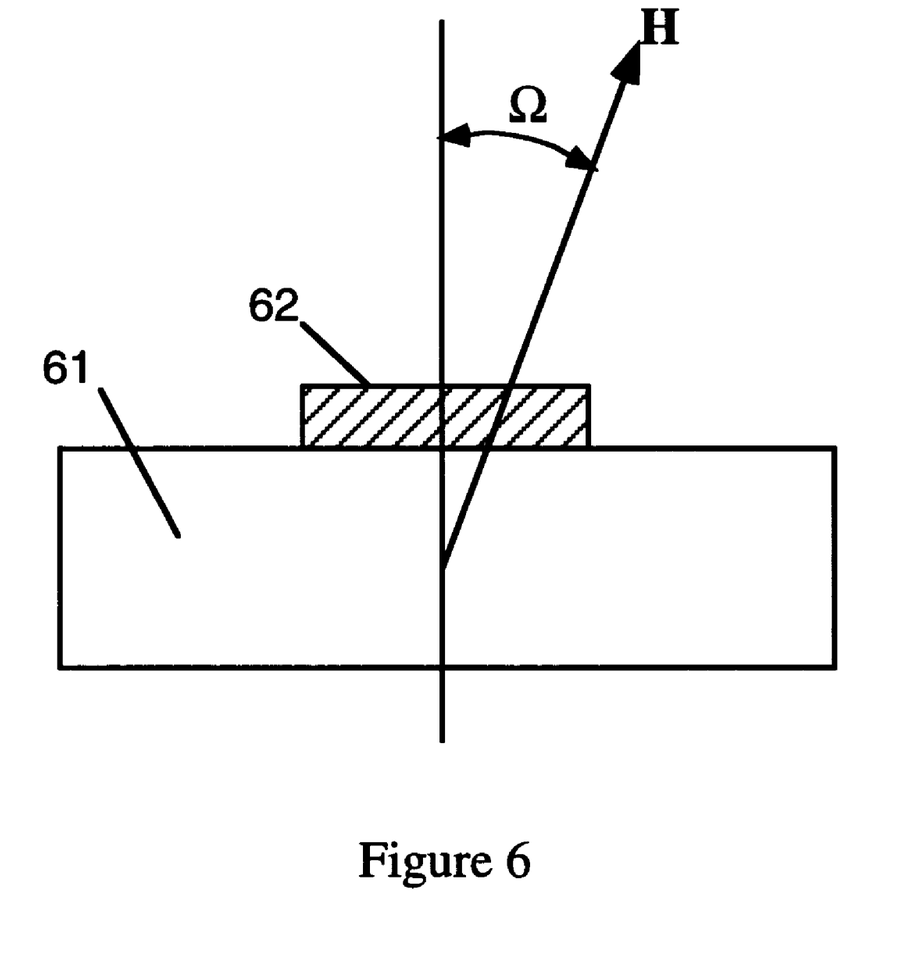
FIG. 6 is a side view of a thin film-type magnetoresistive sensor modified in accordance with the teachings of the present invention.

The field-induced deflection of the current around a conducting "inhomogeneity" embedded in a thin film such as described above will enhance the intrinsic GMR of the material. The enhancement could also be obtained by overlaying the conducting material on the film as shown in the side view in FIG. 6 and tilting the applied field by an angle Ω as shown. That is, a component of the applied magnetic field H is along the top surface of the thin film 61, rather than being in a direction entirely normal to the surface. In the former case, the enhancement will also depend on the film thickness and will increase with decreasing thickness. FIG. 6 shows a side view of a high carrier mobility, preferably having low-conductivity, thin film 61 with a conducting material 62 disposed thereon to constrict the electron path and hence control electron flow in the thin film material. This is particularly useful when the film is part of a giant magnetoresistance sensor. In the presence of an oblique magnetic field, the current density will tend to be expelled from the conducting material 62 on the surface thereby constricting electron flow through the thin film 61. There are numerous geometries that could be employed for the overlayer whose lateral dimensions could be in the range of hundreds of angstroms to millimeters. However, the enhancement of the magnetoresistance would be independent of the thickness of the over layer provided it is nonporous and greater than a few hundred angstroms thick. Such metallic patterning represents a simple and cost effective method for boosting the sensitivity of magnetoresistive field sensors such as semiconductor readheads for high density magnetic recording.

The conducting material in each of the above sensors is any material with a higher conductivity than the high carrier mobility semiconductor material. Examples of the conducting material include the semiconductor material itself with slight modifications in the material parameters such as composition, dopants or dopant concentration to increase conductivity, or alternatively, precipitates formed in growing the semiconductor material, which can be more metallic, or a metal. In the case of a metallic conducting material, any metal that makes good (ohmic) electrical contact to the semiconductor material is preferred, e.g. indium or Cr—Au on HgCdTe, where there are known and standard combinations used in industry. The last example is the preferred embodiment.

In summary, either microscopic or macroscopic conducting imhomogeneities can significantly boost the GMR of high mobility semiconductors, such as $Hg_{1-x}Cd_xTe$, 0<x<1. This property is applicable to MR sensors and particularly GMR sensors used as read-heads for high density magnetic recording. Examples of sensors include Corbinodisc sensors, bar sensors and thin-film sensors.

While there have been described and illustrated preferred embodiments of GMR sensors for practicing the present invention, it will be apparent to those skilled in the art that variations and modifications are possible without deviating from the broad principles and teachings of the present invention which shall be limited solely by the scope of the claims appended hereto.

What is claimed is:

1. A giant magnetoresistance sensor comprising:

a matrix of high carrier mobility semiconductor material;

electrodes coupled to said material for providing a current path through said semiconductor material; and conducting material disposed in relation to said semiconductor material for restricting the current flow between said electrodes in the presence of a magnetic field thereby increasing the magnetoresistance of the sensor.

2. A giant magnetoresistance sensor as set forth in claim 1, where said high carrier mobility semiconductor material is selected from the group consisting of $Hg_{1-x}Cd_xTe$, $0<x<1$, InSb, InAs and $InAs_{1-y}Sb_y$, $y\sim0.6$.

3. A giant magnetoresistance sensor as set forth in claim 2, where said high carrier mobility semiconductor material is $Hg_{1-x}Cd_xTe$, $0<x<1$.

4. A giant magnetoresistance sensor as set forth in claim 3, where x is approximately 0.1.

5. A giant magnetoresistance sensor as set forth in claim 1, where said conducting material is selected from the group consisting of In and Cr—Au.

6. A giant magnetoresistance sensor as set forth in claim 1, where said semiconductor material is also a low-conductivity material.

7. A giant magnetoresistance sensor as set forth in claim 1, where said electrodes comprising an inner electrode and an outer electrode concentrically disposed relative to said inner electrode and said conducting material is a gapped ring concentrically disposed between said inner electrode and said outer electrode.

8. A Corbino-disc sensor comprising:

a matrix of high carrier mobility semiconductor material;

an inner electrode embedded in said semiconductor material;

an outer electrode embedded in said semiconductor material concentrically disposed relative to said inner electrode for providing a current path through said semiconductor material;

a concentrically disposed gapped conducting ring embedded in said semiconductor material disposed between said inner electrode and said outer electrode for restricting the current flow between said inner electrode and said outer electrode in the presence of a magnetic field thereby increasing the magnetoresistance of the Corbino-disc sensor.

9. A Corbino-disc sensor as set forth in claim 8, where said semiconductor material is selected from the group consisting of $Hg_{1-x}Cd_xTe$, InSb, InAs and $InAs_{1-y}Sb_y$, $y\sim0.6$.

10. A Corbino-disc sensor as set forth in claim 9, where said semiconductor material is $Hg_{1-x}Cd_xTe$, $0<x<1$.

11. A Corbino-disc sensor as set forth in claim 10, where x is approximately 0.1.

12. A Corbino-disc sensor as set forth in claim 8, where said semiconductor material is also a low-conductivity material.

13. A bar magnetoresistance sensor comprising:

a bar of high carrier mobility semiconductor material;

electrodes coupled to oppositely disposed ends of said bar for providing a current path through said bar; and conducting material embedded in said bar for restricting the current flow between said electrodes in the presence of a magnetic field thereby increasing the magnetoresistance of the sensor.

14. A bar magnetoresistance sensor as set forth in claim 13, where said high carrier mobility semiconductor material is selected from the group consisting of $Hg_{1-x}Cd_xTe$, InSb, InAs and $InAs_{1-y}Sb_y$, $y\sim0.6$.

15. A bar magnetoresistance sensor as set forth in claim 14, where said high carrier mobility semiconductor material is $Hg_{1-x}Cd_xTe$, $0<x<1$.

16. A bar magnetoresistance sensor as set forth in claim 15, where x is approximately 0.1.

17. A bar magnetoresistance sensor as set forth in claim 13, where said semiconductor material is also a low-conductivity material.

18. A thin film sensor comprising:

a thin film of high carrier mobility semiconductor material;

electrodes coupled to said film for providing a current path through said film; and conducting material disposed relative to said film for restricting the current flow between said electrodes in the presence of a magnetic field thereby increasing the magnetoresistance of the sensor.

19. A thin film sensor as set forth in claim 18, where said high carrier mobility semiconductor material is selected from the group consisting of $Hg_{1-x}Cd_xTe$, InSB, InAs and $InAs_{1-y}Sb_y$, $y\sim0.6$.

20. A thin film sensor as set forth in claim 19, where said high carrier mobility semiconductor material is $Hg_{1-x}Cd_xTe$, $0<x<1$.

21. A thin film sensor as set forth in claim 20, where x is approximately 0.1.

22. A thin film sensor as set forth in claim 18, where a component of an applied magnetic field is in the plane of a surface of the thin film.

23. A thin film sensor as set forth in claim 18, where said conducting material is disposed on a surface of said high carrier mobility semiconductor material.

24. A thin film sensor as set forth in claim 18, where said semiconductor material is also a low-conductivity material.

* * * * *